United States Patent
Siddoway et al.

[11] Patent Number: 5,160,895
[45] Date of Patent: Nov. 3, 1992

[54] MMIC AMPLIFIER WITH EXTENDED DYNAMIC RANGE AND LOW DISTORTION

[75] Inventors: Ronald T. Siddoway; Vaughn H. Estrick, both of Fullerton, Calif.

[73] Assignee: Hughes Aircraft Company, Los Angeles, Calif.

[21] Appl. No.: 684,080

[22] Filed: Apr. 11, 1991

[51] Int. Cl.⁵ .............................................. H03F 1/32
[52] U.S. Cl. ...................................... 330/151; 330/286
[58] Field of Search ............... 330/149, 150, 151, 277, 330/286, 307, 310

[56] References Cited

U.S. PATENT DOCUMENTS

| | | | |
|---|---|---|---|
| 4,583,049 | 4/1986 | Powell | 330/151 |
| 4,617,522 | 10/1986 | Tarbutton et al. | 330/151 X |
| 4,916,407 | 4/1990 | Olver | 330/151 |
| 4,926,134 | 5/1990 | Olver | 330/151 X |

*Primary Examiner*—Steven Mottola
*Attorney, Agent, or Firm*—Wanda K. Denson-Low

[57] ABSTRACT

A Monolithic Microwave Integrated Circuit (MMIC) amplifier with extended dynamic range includes a base circuit for receiving both a first input signal, which is the signal to be amplified, and an amplifier generated second input signal. A power amplifier in the base circuit directly receives and amplifies the first input signal, with some unavoidable distortion to the first input signal. A first directional coupler is connected with the base circuit to couple the output of the power amplifier with the first input signal to cancel the first input signal component from the output of the power amplifier and generate the second input signal which is only distortion. This distortion is then amplified by an error amplifier in the base circuit, and the output of the error amplifier is coupled with the output of the power amplifier through a second directional coupler. This coupling at the second directional coupler cancels the distortion from the output of the power amplifier to provide the desired amplified signal.

1 Claim, 1 Drawing Sheet

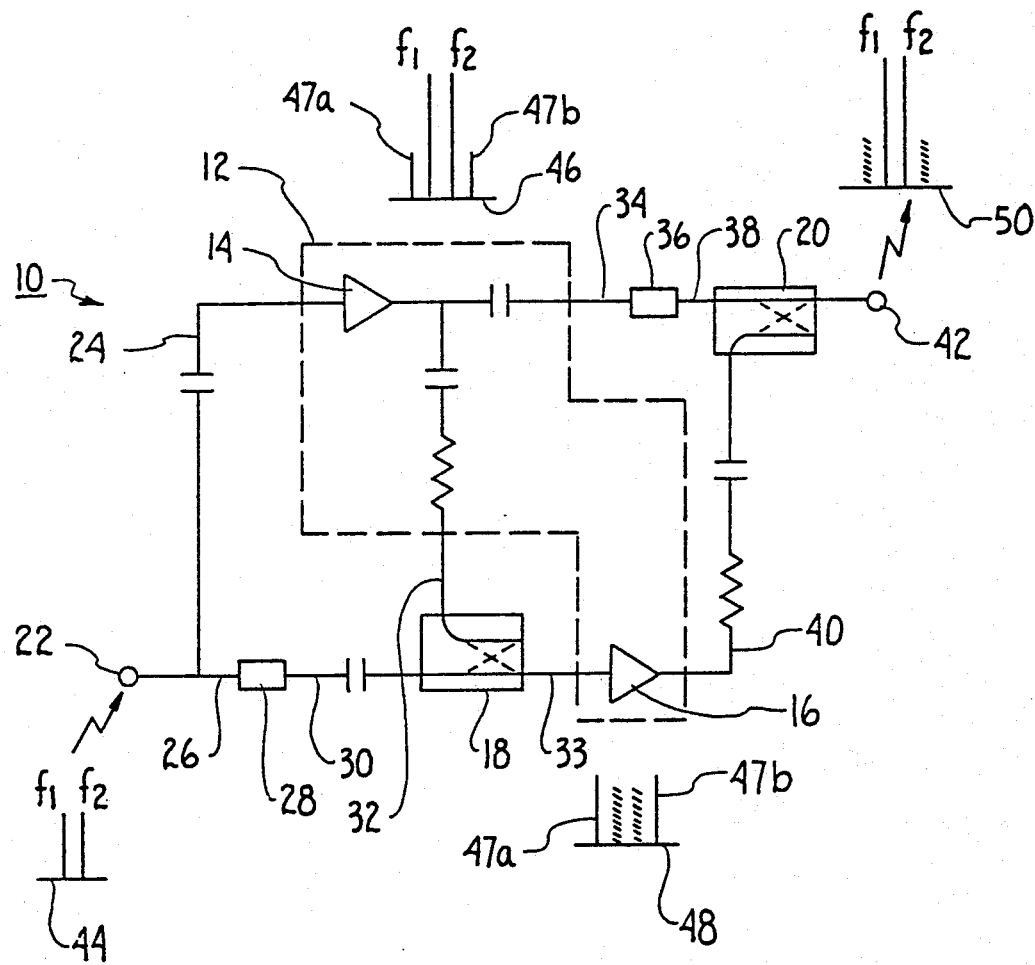

MMIC AMPLIFIER WITH EXTENDED DYNAMIC RANGE AND LOW DISTORTION

FIELD OF THE INVENTION

The present invention pertains generally to electronic amplifiers. More particularly, the present invention pertains to amplifier system component configurations which reduce the distortion levels that are added to an amplified signal by the amplifier. The present invention is particularly, but not exclusively useful for increasing the linear dynamic range of the gain stage of an amplifier.

BACKGROUND OF THE INVENTION

As is well known, various high performance electronic devices must detect signals which are almost completely masked or hidden by signal clutter or interference. The problem, however, involves more than the ability to ascertain a target because, large clutter may also drive the receiver into non-linear operation. When this happens, distortion in the received signal may either appear as false alarms or mask small targets. For example, in the case of Doppler processing radars, the radar must be able to reliably detect and track low radar cross-section targets in the presence of large clutter or severe electronic counter measures (jamming). To do this, these radar systems must process extremely large signals with sufficient sensitivity to search through the clutter or jamming for a weak return from the low radar cross-section target. As a consequence, it is desirable that the receiver add little, if any, noise or distortion to the signal being processed. Further, it is desirable that the receiver maintain linearity over an extremely wide dynamic range of signal levels.

One method for removing system distortion from the received input signal, to thereby extend the intercept point of an amplifier without increasing the output saturation power, is called "feedforward intermodulation distortion cancellation." In essence, this method requires coupling the amplified output signal, which includes distortion added by the amplifier, with the input signal to the amplifier in order to cancel the input signal component from the amplified output signal. The result is a distortion signal. This distortion signal is then amplified and subtracted from the amplified output signal to generate an output signal from which amplifier distortion has been canceled and which is a desired amplification of the input signal.

Conventional circuitry for performing "feedforward intermodulation distortion cancellation" requires two cancellation loops which are formed using a power amplifier, an error amplifier, and four directional couplers. For this conventional circuitry, one directional coupler is used to direct a portion of the input signal to be amplified to the power amplifier. Two directional couplers interconnect the output from the power amplifier with the error amplifier so that the input to the error amplifier will include both a portion of the input signal and a portion of the output from the power amplifier. This connection results in isolating the distortion added by the power amplifier. This distortion is then amplified by the error amplifier. A fourth directional coupler is used to combine the distortion signal output from the error amplifier with the output from the power amplifier to cancel the distortion component from the output of the power amplifier. The result is an amplified signal from which the distortion that was added by the power amplifier has been canceled.

The conventional circuitry, however, suffers from at least two drawbacks. First, it incorporates four directional couplers. These components are bulky and thus, take up space which might otherwise be used to advantage. Second, for this conventional circuitry to work properly, both cancellation loops must be very precisely controlled. It happens that any phase or gain shift in the cancellation loops, such as will occur over time and with variations in temperature, reduces the distortion cancellation abilities of the circuitry. Thus, an implementation which maintains close tracking between critical device parameters is desired. The present invention recognizes that a monolithic microwave integrated circuit (MMIC) has such tracking properties and, that a monolithic circuit can be used with fewer directional couplers to accomplish results similar to those obtained with "feedforward intermodulation distortion cancellation" using conventional circuitry.

In light of the above it is an object of the present invention to provide a MMIC amplifier having an extended dynamic range which minimizes amplifier distortion in the amplified signal. It is another object of the present invention to provide an amplifier which maintains linear operation throughout an extended dynamic range. Yet another object of the present invention is to provide an amplifier which closely tracks the critical device parameters. Still another object of the present invention is to provide an amplifier which requires a minimal number of directional couplers to accomplish the feedforward function of removing undesirable distortion from the amplified signal. Another object of the present invention is to provide a MMIC amplifier having an extended dynamic range which is simple to use, relatively easy to manufacture and comparatively cost effective.

SUMMARY OF THE INVENTION

A monolithic microwave integrated circuit amplifier in accordance with the present invention has a base circuit which includes a power amplifier and an error amplifier. A first directional coupler is connected to the input of the error amplifier and a second directional coupler is connect to the output of the power amplifier. For the present invention both the power amplifier and the error amplifier can comprise a plurality of cascaded field effect transistors (FET). Preferably these field effect transistors are GaAs FETs which inherently provide a high input impedance and a low output impedance for the base circuit. With this configuration of components, the input signal to be amplified is directed to both the power amplifier and to the first directional coupler. This input signal is amplified by the power amplifier, with some unavoidable distortion, and the output from the power amplifier is directed to the second directional coupler. The output of the power amplifier, however, is also provided as an input to the first directional coupler. The result of this connection between the power amplifier and the first directional coupler is that the input signal component of the two inputs to the first directional coupler are canceled. This leaves a signal for output from the first directional coupler which is characteristic of only the distortion which was added by the power amplifier during its amplification of the input signal.

The distortion signal from the first directional coupler is amplified by the error amplifier and then directed to the second directional coupler. At the second directional coupler this distortion signal is coupled with the output from the power amplifier. From this coupling, the distortion in the output from the power amplifier is canceled by the amplified distortion signal from the error amplifier. The result of this cancellation is a system output signal which is substantially an amplified input signal having minimal distortion caused by the gain stage of the power amplifier.

The novel features of this invention, as well as the invention itself, both as to its structure and its operation will be best understood from the accompanying drawings, taken in conjunction with the accompanying description, in which similar reference characters refer to similar parts, and in which:

BRIEF DESCRIPTION OF THE DRAWINGS

The FIGURE is a schematic diagram of the MMIC amplifier with extended dynamic range of the present invention.

DESCRIPTION OF THE PREFERRED EMBODIMENTS

Referring initially to the FIGURE, the monolithic microwave integrated circuit (MMIC) amplifying device of the present invention is shown and generally designated 10. As shown, the device 10 has a base circuit 12 which includes a power amplifier 14 and an error amplifier 16. The device 10 also includes a first directional coupler 18, which is connected between the power amplifier 14 and the error amplifier 16, and a second directional coupler 20 which is connected to the output ends of both the power amplifier 14 and the error amplifier 16 substantially as shown.

The device 10 has an input element 22 which may be any electrical device, such as a standard antenna, that is capable of receiving a microwave input. As shown in FIG. 1, device input element 22 is connected to power amplifier 14 via a line 24, and to a delay 28 via a line 26. The delay 28 may be of any type well known in the pertinent art which is able to equalize or compensate for any inherent delays caused by the operation of power amplifier 14. For example, the delay 28 may be a coaxial cable or a microstrip transmission line. The compensation caused by delay 28 is necessary in order to provide properly phased input signals to the first directional coupler 18 from the device input element 22 and from the power amplifier 14. Specifically, both the delay 28 and the power amplifier 14 are connected to the first directional coupler 18 through the lines 30 and 32, respectively. The first directional coupler 18, in turn, is connected to error amplifier 16 through line 33.

A line 34 is used to connect power amplifier 14 to a delay 36 which is similar in type and function to the delay 28. As used here, however, delay 36 compensates for any delays caused by error amplifier 16. More specifically, delay 36 is connected to second directional coupler 20 via line 38, and error amplifier 16 is connected to second directional coupler 20 via line 40. With this connection, and depending on the delay which is set by the delay 36, a properly phased input from both power amplifier 14 and error amplifier 16 is provided for second directional coupler 20. The second directional coupler 20 is then connected directly to the device output 42.

OPERATION

The operation of the device 10 of the present invention will be best understood by considering a microwave input signal 44 which, for purposes of discussion, is shown to include two sine waves. One sine wave is of frequency $f_1$ and the other sine wave is of a frequency $f_2$. This input signal 44 is received by the input element 22 of device 10 and passed via line 24 to power amplifier 14 where the input signal 44 is amplified. Due to inherent non-linearity in the operation of power amplifier 14, the amplified signal 46 at the output from this amplifier 14, is an amplification of input signal 44 plus some distortion 47a,b. Specifically, distortion 47a will be equal to $2f_1-f_2$ and the distortion 47b will be equal to $2f_2-f_1$. Additionally, the amplification of input signal 44 by power amplifier 14 causes some inherent delay in the generation of the amplified signal 46.

The FIGURE also shows that input signal 44 is passed from the input terminal 22 via line 26 to delay 28. At the delay 28, input signal 44 is delayed to equalize, or compensate for, the delay caused by power amplifier 14 in generating amplified signal 46. The result is that amplified signal 46 and input signal 44 are properly directed to first directional coupler 18 for effective coupling. At this point it is also well to mention that the inherent high input impedance and low output impedance of base circuit 12, and more particularly that of the power amplifier 14, allows for proper matching of the signals which are input to first directional coupler 18.

In a manner well understood by those skilled in the pertinent art, first directional coupler 18 effectively subtracts the input signal 44 from the amplified signal 46. The result is a distortion signal 48 which includes only the distortions 47a,b. It is this distortion signal which is amplified by the error amplifier 16 and passed via line 40 to the second directional coupler 20. Simultaneously, the amplified signal 46 is passed from power amplifier 14 via line 34 to the delay 36, where it is equalized to compensate for the delay inherent in amplifying the distortion signal 48 at error amplifier 16. This amplified signal 46, which is now delayed by the delay 36, is passed via line 38 to the second directional coupler 20. At second directional coupler 20, the amplified distortion signal 48 from error amplifier 16 is subtracted from the amplified signal 46. With this subtraction accomplished by second directional coupler 20, an output signal 50 from device 10 is generated at the output terminal 42. Effectively, output signal 50 contains only an amplification of the frequencies $f_1$ and $f_2$ from the input signal 44 and the distortions 47a,b generated during the amplification of input signal 44 have been removed.

For purposes of the present invention, the first directional coupler 18 and the second directional coupler 20 are of a type commonly referred to as a Lauge coupler. As will be appreciated by the skilled artisan, the first directional coupler 18 and the second directional coupler 20 can be realized on a microstrip circuit which also contains the MMIC circuit having the power amplifier 14 and the error amplifier 16. Also, the power amplifier 14 and the error amplifier 16 are manufactured for the MMIC base circuit 12 using gallium arsenide (GaAs) field effect transistors (FETs). Further the GaAs FETs are cascaded, in a manner well know in the art, to obtain the necessary gain for operation of the device 10.

While the particular MMIC amplifier having an extended dynamic range as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. A monolithic integrated circuit amplifier with extended dynamic range and low distortion comprising:
   a) an input element for receiving a microwave input signal;
   b) a power amplifier having an input and an output, the input of the power amplifier being coupled to receive said microwave input signal;
   c) a first delay device having an input and an output, the input of said first delay device being coupled to receive said microwave input signal;
   d) a first directional coupler having a first input and a second input and an output, said first directional coupler effectively subtracting a signal received on the second input from a signal received on the first input, said first directional coupler being coupled to receive the output of the power amplifier on the first input and to receive the output of said first delay device on the second input;
   e) a distortion amplifier having an input and an output, the input of the distortion amplifier being coupled to receive the output of said first directional coupler;
   f) a second delay device having an input and an output, the input of said second delay device being coupled to receive the output of said power amplifier; and
   g) a second directional coupler having a first input and a second input and an output, said second directional coupler effectively subtracting a signal received on the second input from a signal received on the first input, said second directional coupler being coupled to receive the output of the power amplifier on the first input and to receive the output of said distortion amplifier on the second input; and
   g) an output element coupled to the output of said second directional coupler for providing the output of said monolithic integrated circuit amplifier.

* * * * *